United States Patent
Conrad et al.

(10) Patent No.: US 7,170,341 B2
(45) Date of Patent: Jan. 30, 2007

(54) LOW POWER CONSUMPTION ADAPTIVE POWER AMPLIFIER

(75) Inventors: Clark Conrad, Chicago, IL (US); Armin Klomsdorf, Libertyville, IL (US); Ernest Schirmann, Lake Zurich, IL (US)

(73) Assignee: Motorola, Inc., Schaumburg, IL (US)

( * ) Notice: Subject to any disclaimer, the term of this patent is extended or adjusted under 35 U.S.C. 154(b) by 358 days.

(21) Appl. No.: 10/634,610

(22) Filed: Aug. 5, 2003

(65) Prior Publication Data
US 2005/0030094 A1 Feb. 10, 2005

(51) Int. Cl.
*H03F 1/14* (2006.01)

(52) U.S. Cl. .................... 330/51; 330/302; 330/296; 330/297

(58) Field of Classification Search .................. 330/51, 330/302, 296, 297
See application file for complete search history.

(56) References Cited

U.S. PATENT DOCUMENTS

| | | | |
|---|---|---|---|
| 5,438,684 A * | 8/1995 | Schwent et al. ......... 455/552.1 |
| 5,548,246 A * | 8/1996 | Yamamoto et al. ........... 330/51 |
| 5,625,322 A | 4/1997 | Gourgue et al. |
| 5,774,017 A * | 6/1998 | Adar ........................... 330/51 |
| 5,834,975 A * | 11/1998 | Bartlett et al. ............... 330/278 |
| 6,122,488 A * | 9/2000 | Leizerovich et al. .......... 455/78 |
| 6,215,987 B1 * | 4/2001 | Fujita ....................... 455/127.3 |
| 6,400,227 B1 * | 6/2002 | Goldfarb et al. ............ 330/295 |
| 6,597,242 B2 * | 7/2003 | Petz et al. .................... 330/51 |
| 6,614,299 B2 * | 9/2003 | Hirvilampi et al. ..... 330/124 R |
| 6,794,935 B2 * | 9/2004 | Klomsdorf et al. ......... 330/129 |

* cited by examiner

*Primary Examiner*—Patricia Nguyen
(74) *Attorney, Agent, or Firm*—Vedder, Price, Kaufman & Kammholz, P.C.

(57) ABSTRACT

A power amplification circuit (10) includes a scalable power amplifier (20) to produce an RF output signal (50) at an output of the power amplification circuit (10), and a variable impedance circuit (30) coupled to the output of the power amplification circuit (10). The scalable power amplifier (20) includes a plurality of selectively activated amplifier elements (22), (24), (26) to produce the RF output signal (50) in accordance with a desired RF output signal power level. The power amplification circuit (10) selectively activates individual amplifier elements by, for example reducing power or increasing power to at least one amplifier element. The variable impedance circuit (30) varies an impedance of the variable impedance circuit (30) to dynamically load the output of the scalable power amplifier (20).

17 Claims, 8 Drawing Sheets

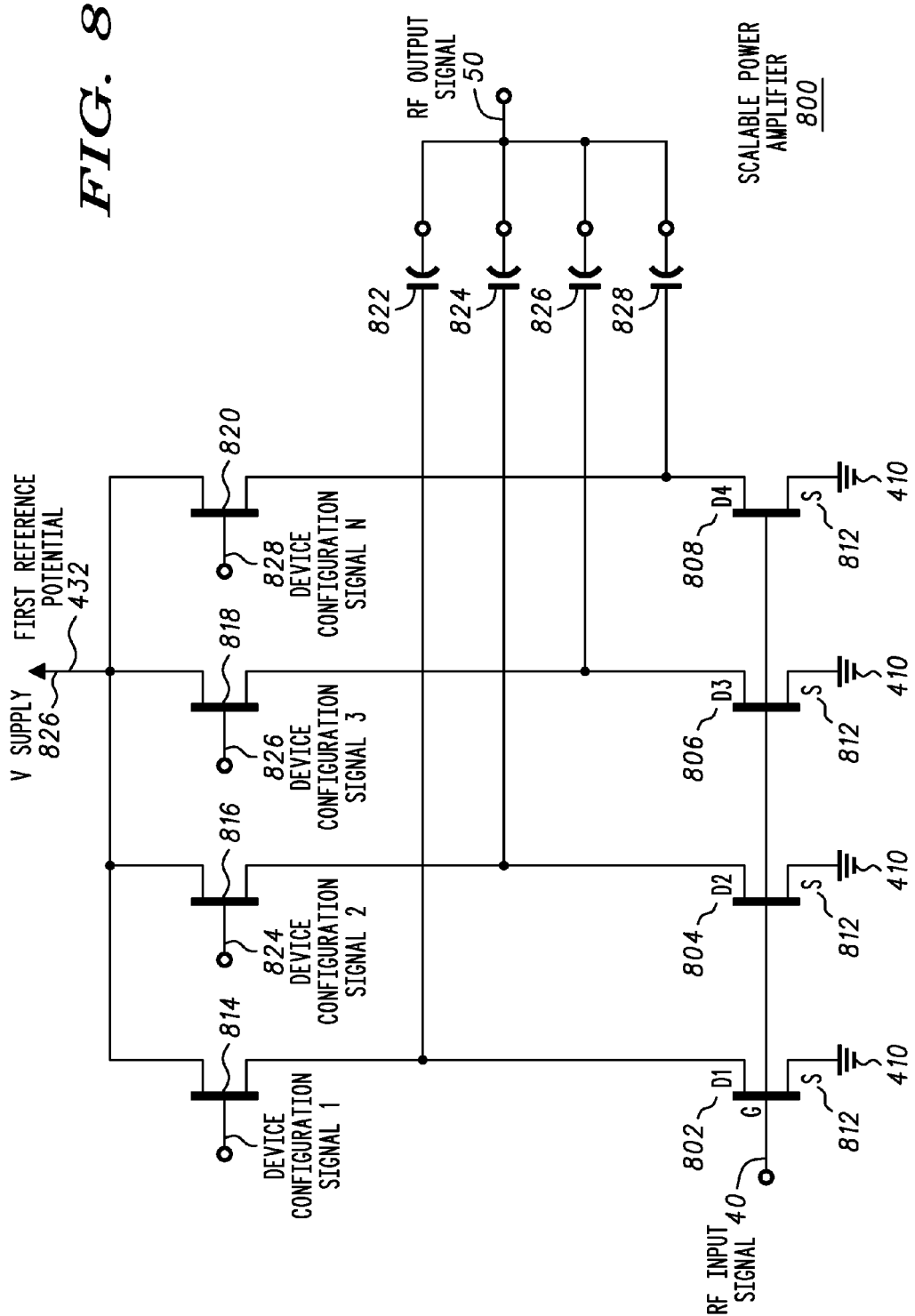

LOW POWER CONSUMPTION ADAPTIVE POWER AMPLIFIER

RELATED APPLICATION

This application is related to a co-pending patent application Ser. No. 10/272,964, to Klomsdorf, et al., entitled "Power Amplification Circuit and Method for Supplying Power at a Plurality of Desired Power Output Levels," filed on Oct. 17, 2002, which is assigned to instant assignee.

FIELD OF THE INVENTION

The present invention relates generally to a power amplifier circuit and more particularly, to a power amplifier circuit for providing an RF output signal at a plurality of desired power output levels.

BACKGROUND OF THE INVENTION

Many wireless communication protocols provide for transmitters, operating within a communication network, which are capable of transmitting at varying levels of output power. One reason for having varying levels of output power is to accommodate transmitters in wireless devices such as wireless telephones, wireless personal data assistants (PDAs), pagers, two-way radios, and other types of wireless devices, which may be located at a varying distance from a base station. In some instances, the wireless communication protocol requires that the signal being received by the base station is received at a relatively constant or fixed power level.

Examples of such protocols include Code Division Multiple Access (CDMA) and Wideband Code Division Multiple Access (WCDMA). To accommodate this requirement, a mobile transmitter will transmit at one of several power output levels, dependent upon the level at which the signal is being received. Other examples, where the transmitted output power can be varied, include Enhanced Data Rates for Global Systems for Mobile Communications Evolution (EDGE) and Global System for Mobile communications (GSM) which provides for a range of output power control of mobile transmitters between 20 dB and 30 dB, which is controllable in steps of 2 dB, and earlier analog cellular standards, which call for seven 4 dB steps in power output of the radio transmitter. Further, multimode wireless devices are designed to transmit communication signals of different modulation schemes using a single power amplifier. Therefore, the single power amplifier must also be capable of transmitting at the power output levels required for each of the different modulation schemes.

The single power amplifier in the wireless device is typically designed to operate most efficiently at the highest power level rather than at the lowest power level. This is because relatively larger amounts of power are consumed when the power amplifiers are operating at the highest power levels than when power amplifiers are operating at lower power levels. Consequently, designing a power amplifier for high efficiency at high output power levels has generally resulted in power amplifiers that sacrificed power efficiencies at lower power levels. However, the wireless device is generally only required to transmit at its maximum power level when the path losses are the greatest. Correspondingly, the wireless device will typically transmit at lower power levels for a larger percentage of the time, that the wireless device is transmitting. Consequently, typical power amplifiers have less than optimal efficiency most of the time that the wireless device is transmitting at low power levels since they were designed to operate most efficiently at high power levels. As a result, these amplifiers do not consume the lowest possible amount of power.

Power amplifiers required to transmit signals of different modulation schemes are typically optimized for operation when using one modulation scheme, such as non-linear modulation. As a result, when the power amplifier is using another modulation scheme, such as linear modulation, the power amplifier is less efficient. For example, in a wireless device operating with linear modulation, such as in CDMA, linear modulation quality is required over a wide power output range. By contrast, in a wireless device operating with non linear modulation, such as in GSM, a constant amplitude GSM signal is required through out the required output power range in order for the power amplifier to operate at high efficiency levels. As a result, if a power amplifier is optimized for linear modulation, the power amplifier will not provide high levels of efficiency when operating with non linear modulation.

One example of a technique for improving the efficiency of a power amplifier at low power levels is to turn off or removing the bias signal from sections of a final stage amplifier in a multi-stage power amplifier. However, turning off sections or removing the bias signal from sections of the final stage amplifier affects other parameters of the power amplifier, such as the optimum output current and voltage operating region, power amplifier loading, and power amplifier output impedance. As a result, this technique alone does not provide optimal performance for minimizing power consumption at low power levels.

Another technique which has been used to enhance operating efficiencies at lower power output values has included reducing the bias signal supplied to the power amplifier. However, there is a limit to the amount that the bias signal can be reduced. Reducing the bias too much will lead to distortion, and therefore increase the likelihood that spurious signals will enter adjacent channels in the communication system. Further, the distortion may negatively affect the ability of a base station receiver to detect the incoming signal from the wireless device transmitter.

A further technique, which has been used to enhance operating efficiencies at lower power output levels of the RF output signal, is to adjust a load impedance coupled to the output of the power amplifier. However, as the power output levels of the RF output signal moves further away from the original maximum required, a greater impedance change becomes necessary to maintain performance.

Still, a further technique has combined varying a bias signal supplied to the power amplifier with varying a load impedance applied to an output of the amplifier. This allows the distortion effect associated with reducing the bias signal to be at least partially mitigated. However, this technique does not provide optimal efficiency for minimizing power consumption.

BRIEF DESCRIPTION OF THE DRAWINGS

The present invention is illustrated by way of example and not limitation in the accompanying figures, in which like reference numerals indicate similar elements, and in which:

FIG. 8 is a schematic of an exemplary amplifier element according to one embodiment of the invention.

DETAILED DESCRIPTION OF THE PREFERRED EMBODIMENT

Figure 1:
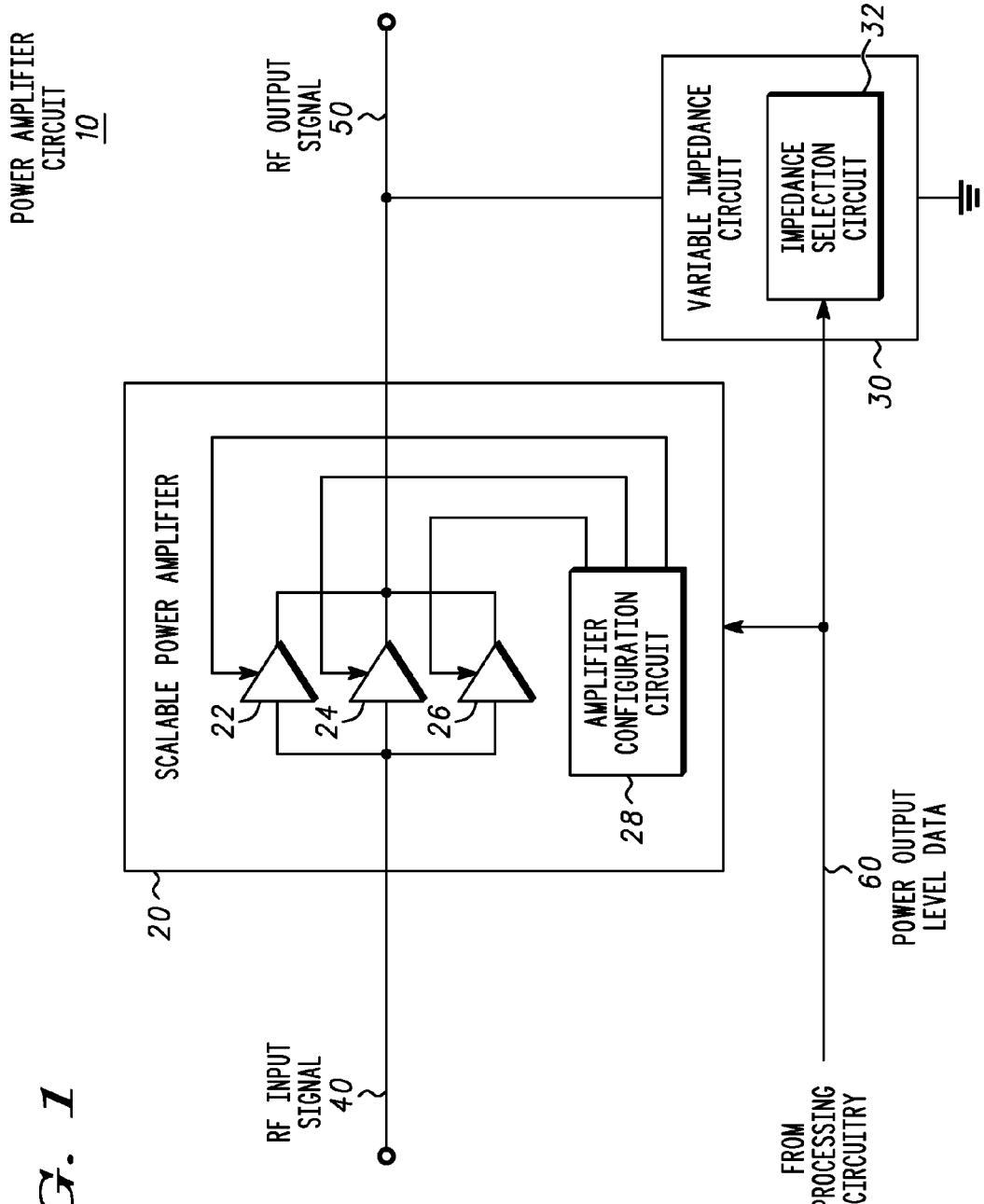
FIG. 1 is a block diagram of a power amplification circuit according to one exemplary embodiment of the invention.

A power amplification circuit includes a scalable power amplifier to produce an RF output signal at an output of the power amplification circuit, and a variable impedance circuit coupled to the output of the power amplification circuit. The scalable power amplifier includes a plurality of selectively activated amplifier elements to produce the RF output signal in accordance with a desired RF output signal power level. The power amplification circuit selectively activates individual amplifier elements by, for example adjusting the power supplied to the individual amplifier element, and selectively decoupling the RF input signal to at least one amplifier element. The variable impedance circuit varies an impedance of the variable impedance circuit to dynamically adjust the value of the load coupled to the output of the scalable power amplifier If the required RF output signal power level decreases for example, then individual amplifier elements may be selectively deactivated and the load impedance at the output adjusted in order for the scalable power amplifier to operate at a high level of efficiency for the newly selected RF output signal power level. Similarly, if the required RF output signal power level increases, then individual amplifier elements may be selectively activated and the load impedance at the output readjusted in order for the scalable power amplifier to maintain operation at a high level of efficiency for the newly selected RF output signal power level. Accordingly, a desired power output level is associated with a number of activated amplifiers elements in order to provide the required RF output signal power level at an optimal level of efficiency. Similarly, an output impedance load is associated with the number of activated amplifiers to accommodate a mere optimal level of efficiency.

Among other advantages, each amplifier element may be selectively activated and the load impedance at the output varied in a coordinated manner to provide the required RF output signal power level. As a result, the power amplifier circuit operates at a high level of efficiency through out a range of RF output signal power levels. Since the power amplifier circuit operates at a high level of efficiency, power consumption of the power amplification circuit is minimized.

The power amplification circuit may further include a variable bias circuit to control the bias of the selectively activated amplifier elements. The bias of the selectively activated amplifier elements may be controlled collectively in groups or individually. The variable bias circuit has at least a first and second power amplifier bias configurations to configure each selectively activated amplifier element for at least two different operating regions. In at least one embodiment, at least one of the amplifier element is configured in a reduced bias configuration if the RF output signal power level decreases. The bias level of each of the selectively activated amplifier elements may be associated with the desired power output level. The performance of the power amplifier circuit can therefore be adjustively configured by selectively activating individual amplifier elements, varying the load impedance at the output, and controlling the bias of each of the selectively activated amplifier elements.

In a further embodiment, the power amplification circuit includes a device configuration circuit for configuring the scalable power amplifier in accordance with a desired power output level such that the power amplification circuit operates at an optimum efficiency level. The device configuration circuit may further include an amplifier configuration circuit, an impedance configuration circuit, and a bias adjust circuit. The device configuration circuit, may be for example, a microprocessor or other circuit suitable to receive output power level data and to dynamically configure the scalable power amplifier and the variable impedance circuit. The output power level data received by the device configuration circuit corresponds to a predetermined desired output power level. The impedance configuration circuit provides a variable load impedance signal to the variable impedance circuit to load the output of the scalable power amplifier. Similarly, the variable bias circuit produces a bias control signal to vary the bias of the scalable power amplifier. Accordingly, the device configuration circuit, and the variable bias circuit may together configure the scalable power amplifier according to changes in a desired RF signal output power level.

An amplification method selectively activates at least one selectively activated amplifier element and varies an impedance of the variable impedance circuit to vary the power output level of an amplifier circuit. For example, a device configuration circuit dynamically configures the scalable power amplifier and the impedance of the variable impedance circuit based on a desired power amplifier output level. Further, a different bias is applied to each individual power amplifier element at different RF power output levels. As previously stated, each amplifier element may be selectively activated, the load impedance at the output varied, and the bias adjusted to provide a more optimal level of performance at the required RF output signal power level.

The scalable power amplifier may fulfill a multi-mode role in order to overcome conflicting design requirements, such as operating with linear EDGE modulation or saturated non-linear GSM modulation. The scalable power amplifier may therefore be dynamically configured to operate with different types of modulation, such as linear or nonlinear modulation, at any desired power level, to achieve a high efficiency level, resulting in reduced power consumption.

FIG. 1 illustrates one example of a power amplification circuit 10 including a scalable power amplifier 20, a plurality of selectively activated amplifier elements 22, 24, 26 (i.e. a first amplifier element, a second amplifier element, and an Nth amplifier element where N is an integer), an amplifier configuration circuit 28, a variable impedance circuit 30, and an impedance selection circuit 32. In at least some embodiments, the individual amplifier elements may be identical, while in at least some other embodiments, the characteristics of some of the individual amplifier elements may vary. The scalable power amplifier 20 receives an RF input signal 40 and produces an RF output signal 50. Amplifier configuration circuit 28 receives power output level data 60 and responsively configures the scalable power amplifier 20 to vary a power output level of the RF output signal 50. The scalable power amplifier 20 is reconfigured to selectively activate individual amplifier elements 22, 24, 26 by, for example, adjusting the supply voltage to the individual amplifier elements, and selectively decoupling or reducing an amplitude of the RF input signal 50 coupled to at least one amplifier element in order to minimize a power consumption of scalable power amplifier 20. For example, scalable power amplifier 20 may be reconfigured by selectively turning off activated amplifier elements 22, 24, 26, within the scalable power amplifier 20, by adjusting an operating bias of each amplifier element within scalable power amplifier 20, or by any other suitable mechanism.

Variable impedance circuit 30 is coupled to an output of the scalable power amplifier 20 to vary an impedance of the variable impedance circuit 30 and to dynamically load the output of the scalable power amplifier 20. The impedance selection circuit 32 receives the power output level data 60 to control the variable impedance circuit 30. For example, the power output level data 60 may indicate to the impedance selection circuit 32 that the power output level of the RF output signal 50 is changing and therefore the impedance of the variable impedance circuit 30 may be appropriately matched to the scalable power amplifier 20 so that the appropriate amplifiers within scalable power amplifier 20 may operate in an optimum operating region.

Figure 2:
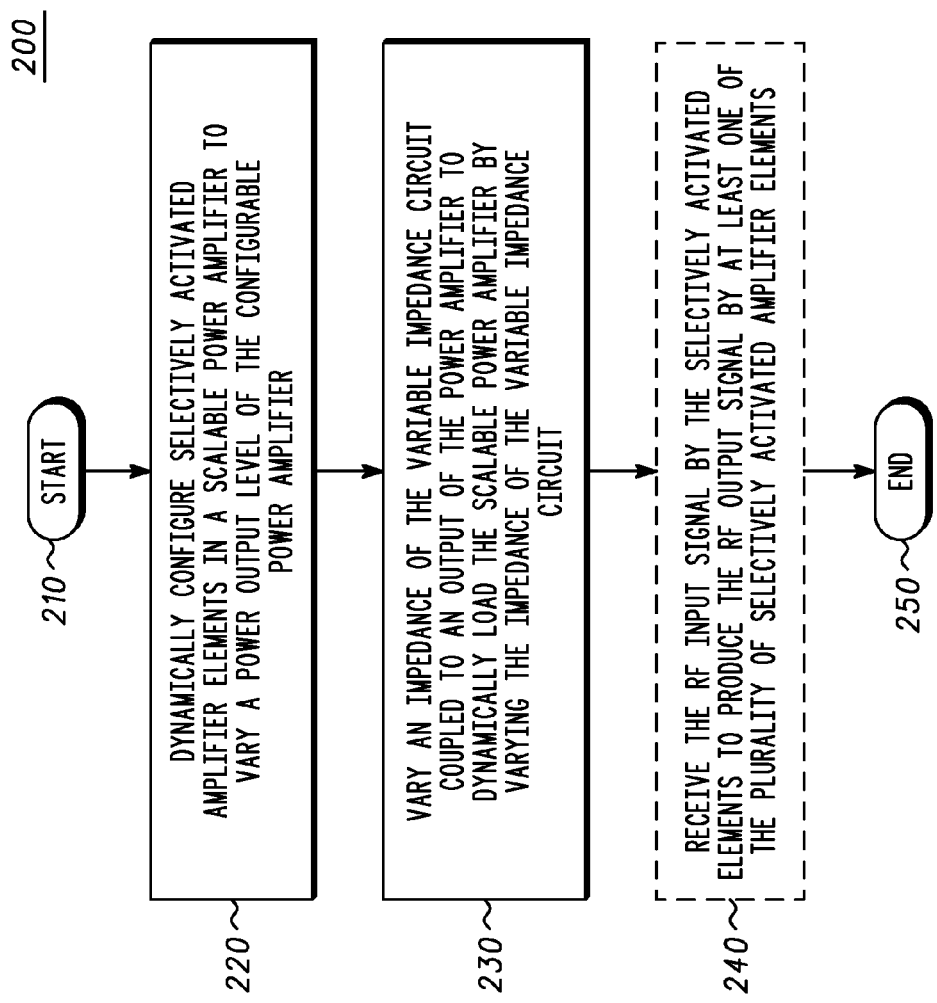
FIG. 2 is a flow chart of an amplification method according to one exemplary embodiment of the invention.

FIG. 2 illustrates one example of an amplification method 200 for dynamically configuring the selectively activated amplifier elements to operate at a high level of efficiency at varying power levels. The method 200 may be carried out by the power amplification circuit 10. However, any other suitable structure may also be used. It will be recognized that the method 200, beginning with step 210, will be described as a series of operations, but the operations may be performed in any suitable order.

As shown in step 220, the scalable power amplifier 20 dynamically configures the selectively activated amplifier elements 22, 24, 26 within the scalable power amplifier 20 to vary a power output level of the scalable power amplifier 20. As shown in step 230, the impedance selection circuit 32 varies an impedance of the variable impedance circuit 30. The variable impedance circuit 30 dynamically loads the scalable power amplifier 20 by varying the impedance of the variable impedance circuit 30.

As shown in optional step 240, the scalable power amplifier 20 includes a plurality of selectively activated amplifier elements, each capable of receiving the RF input signal 40 to collectively produce the RF output signal 50. Accordingly, at least one of the plurality of selectively activated amplifier elements 22, 24, 26 may produce the RF output signal 50 in response to receiving the RF input signal 40. For example, the selectively activated amplifier elements 22, 24, 26 may be configured in parallel, series, or any other suitable configuration such that each power amplifier element, or multiple power amplifier elements may individually contribute to providing an RF output signal 50 in response to receiving the RF input signal 40.

The amplification configuration circuit 28 receives the power output level data 60, and in response dynamically varies the level of operation at least one of the selectively activated amplifier elements 22, 24, 26, to vary an output power level of the RF output signal 50. According to another embodiment the scalable power amplifier 20 receives a bias control signal to control a bias of the scalable power amplifier. For example, the bias control signal may control one or more of the selectively activated amplifier elements 22, 24, 26, such as a power amplifier transistor, in order to control the bias of each or at least one of the power amplifier transistors. As a result, the optimum operating region for the scalable power amplifier 20 may be established in order to increase the overall efficiency of the scalable power amplifier 20, especially at low power output levels.

Figure 3:
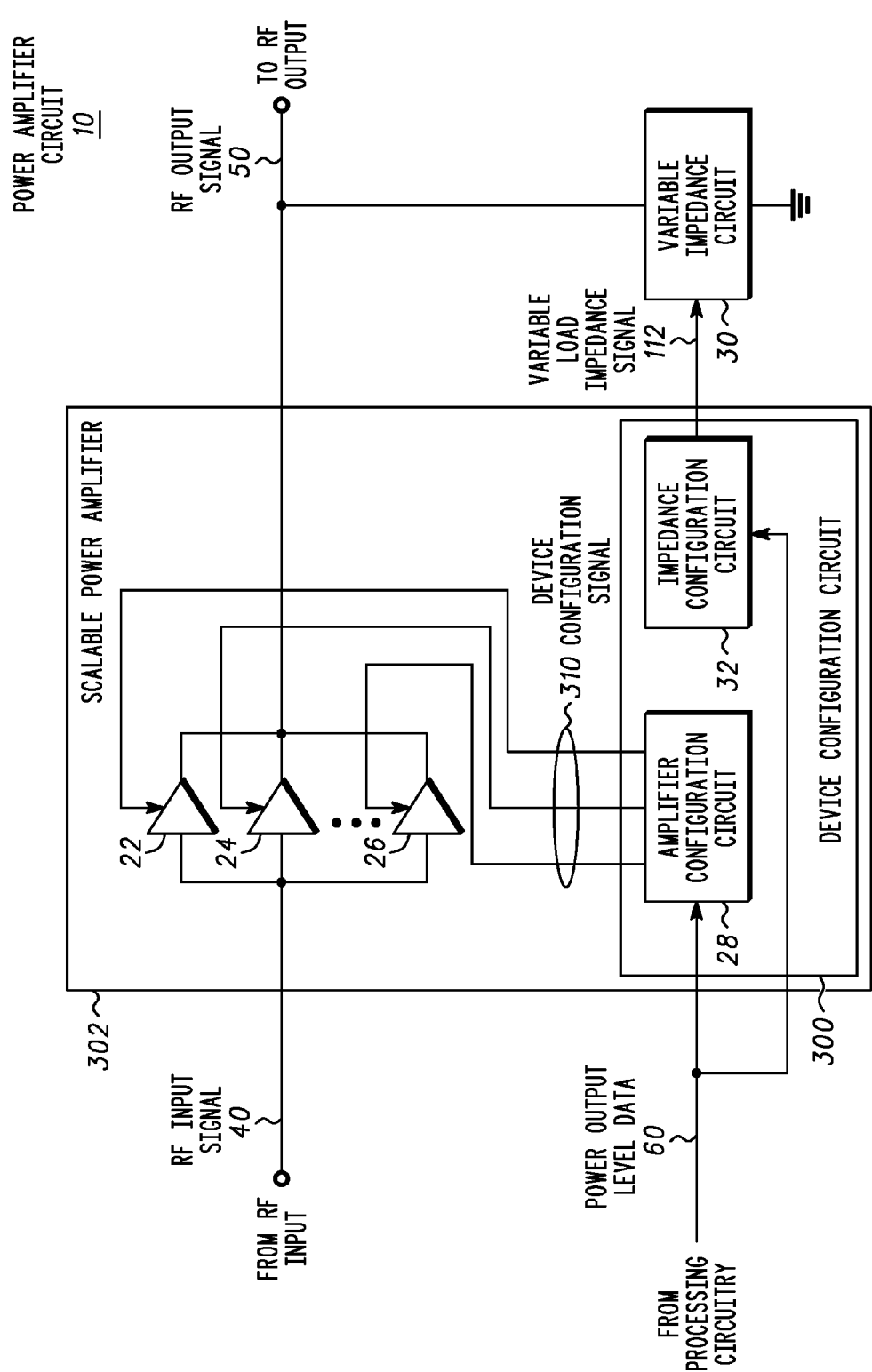
FIG. 3 is a block diagram of a power amplification circuit employing a plurality of amplifier elements according to an exemplary embodiment of the invention.

FIG. 3 illustrates one embodiment of the power amplification circuit 10 according to another embodiment of the invention. According to this embodiment, scalable power amplifier 20 includes a device configuration circuit 300, and the plurality of selectively activated amplifier elements 22, 24, 26. As previously stated, each of the selectively activated amplifier elements 22, 24, 26 receives the RF input signal 40 and function together to produce or to each contribute to the generation of the RF output signal 50. According to one embodiment, each selectively activated amplifier element 22, 24, 26 may operate at a first power output level, for example, corresponding to a low power output level and a second power output level such as, for example, a high power output level.

The device configuration circuit 300 includes the amplifier configuration circuit 28 and the impedance configuration circuit 32. The amplifier configuration circuit 28 is coupled to at least one of the plurality of selectively activated amplifier elements 22, 24, 26 to provide a corresponding device configuration signal 310 in response to the power output level data 60. The device configuration signal 310 configures each corresponding selectively activated amplifier element 22, 24, 26. According to one embodiment, the device configuration circuit is a microprocessor such as a digital signal processor or any other suitable device for configuring the selectively activated amplifier elements 22, 24, 26. The device configuration circuit may configure some of the selectively activated amplifier elements 22, 24, 26 to operate at the first power output level and the remaining selectively activated amplifier elements 22, 24, 26 to operate in the second power output level.

For example, amplifier configuration circuit 28 produces the device configuration signal 310 to, for example, reduce power or change the bias of each of the selectively activated amplifier elements 22, 24, 26. The device configuration signal 310 may be an analog signal to control the power or bias supplied to each of the selectively activated amplifier elements 22, 24, 26. Accordingly, each selectively activated amplifier element 22, 24, 26 may include a circuit, such as a switch, to control the supply of power or bias of each selectively activated amplifier element 22, 24, 26.

Alternatively, the device configuration signal 310 may represent digital data that is decoded by each of the selectively activated amplifier elements 22, 24, 26 for controlling the power or bias supplied to each amplifier element. Each amplifier element may include a circuit to read and record the digital data from device configuration signal 310 to control the internal power or bias, such as a switch, of each selectively activated amplifier element 22, 24, 26.

The impedance configuration circuit 32 provides a variable load impedance signal 312 to the variable impedance circuit 30. In response to receiving the variable load impedance signal 312, the variable impedance circuit 30 provides at least either a first impedance load at the output of the scalable power amplifier 20 and a second impedance load at the output of the scalable power amplifier 20. The impedance of the variable impedance circuit 30 is adjusted in order to provide the optimum operating range for the selectively activated amplifier elements 22, 24, 26.

Figure 4:
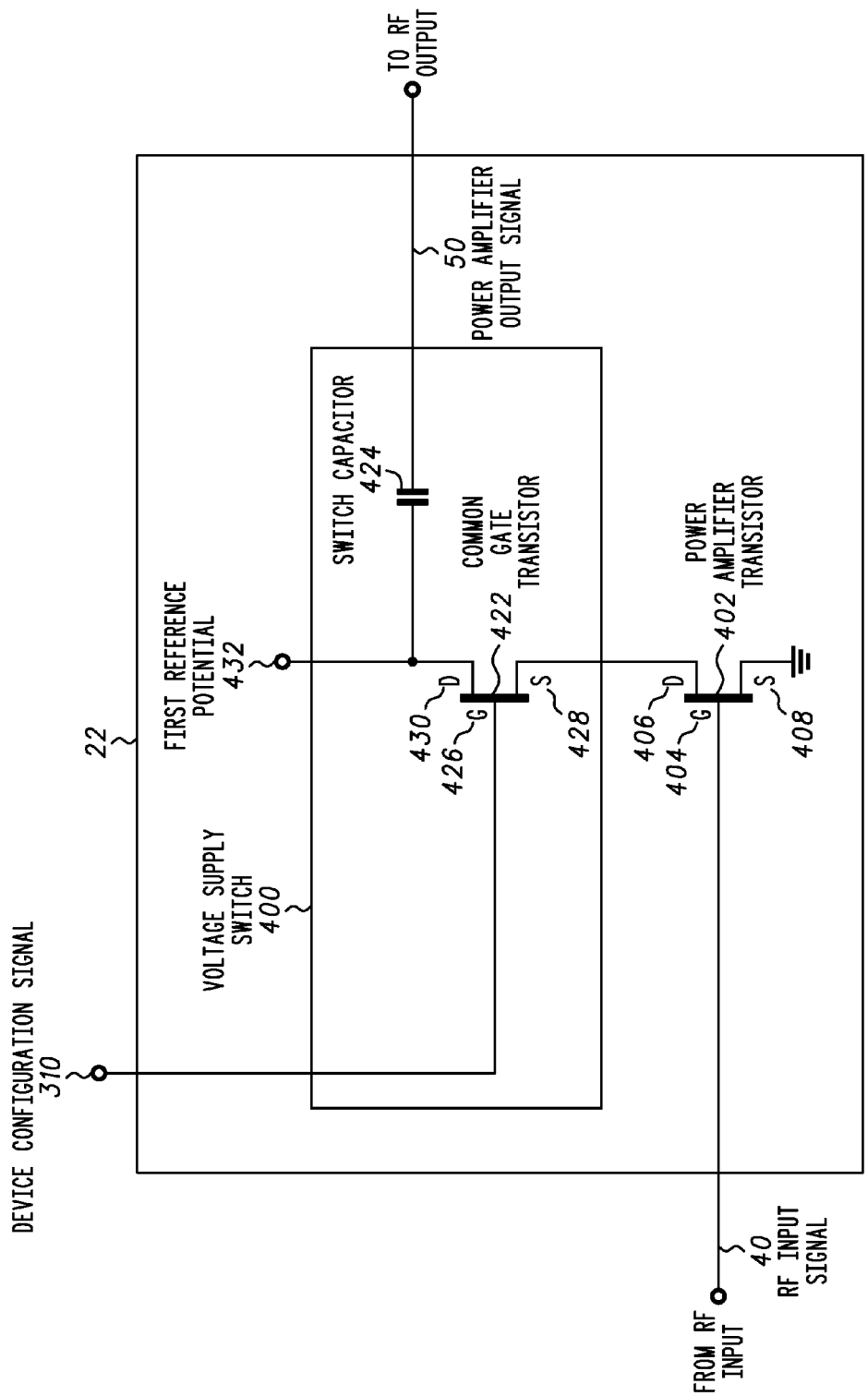
FIG. 4 is a schematic of an exemplary amplifier element according to one embodiment of the invention.

FIG. 4 is a schematic diagram of one of the plurality of amplifier elements 22, 24, 26, (such as the first amplifier element as shown) according to one embodiment including a power supply switch 400 and a power amplifier transistor 402. According to one embodiment, each selectively activated amplifier element 22, 24, 26 includes the power amplifier transistor 402 such as a field effect transistor (FET) transistor including a gate 404, a drain 406, and a source 408. The gate receives the RF input signal 40. The drain 406 is coupled to the voltage supply switch 400 to receive the reference potential 432 in response to the device configuration signal 310. The source 408 is coupled to a second reference potential 410, such as a ground point.

According to one embodiment, the voltage supply switch 400 substantially removes the first reference potential 432 from the drain 406 of power amplifier transistor 402 to turn off power amplifier transistor 402. According to another embodiment voltage supply switch 400 does not completely turn off power amplifier transistor 402, but rather reduces the voltage to power amplifier transistor 402. Accordingly, while operating in the second power output level according to one embodiment, the power amplifier transistor 402 does not substantially consume power from the first reference potential 432. Voltage supply switch 400 may transition power from the first reference potential 432 to the drain 406 in for example a continuous manner such that the power applied from the first reference potential 432 is applied in a continuously variable manner to drain 406. Alternatively, power is transferred from first reference potential 432 to the drain 406 in a discrete manner, such as in discrete steps of, for example, 100%, 90%, 80%, 75%, 2% and so forth.

The voltage supply switch 400 includes a common gate transistor 422 and a switch capacitor 424. The common gate transistor 422 includes a gate 426, a source 428, and a drain 430. The gate 426 receives the corresponding device configuration signal 310. The drain 430 receives a first reference potential 432. The source 428 is coupled to the drain 406 of power amplifier transistor 402. Alternatively, the gate 426 of transistor 422 may be a bipolar transistor, or any other suitable device. For example, the common gate transistor 422 may supply the first reference potential 432 to the drain 406 of the power amplifier transistor 402 in response to receiving an enable signal on device configuration signal 310 on the gate 426 of the common gate transistor 422. The enable signal on gate 426 may turn on common gate transistor 422 to provide a voltage from the first reference potential 432 to the source 428 in order to power the power amplifier transistor 402. The device configuration signal 310 may have associated with it a disable signal at the gate 426 of common gate transistor 422 to reduce power from the first reference potential 432 to the source 428. Accordingly, the voltage level of device configuration signal 310 enables and disables the common gate transistor 422 and thereby turns off power amplifier transistor 402.

Figure 5:
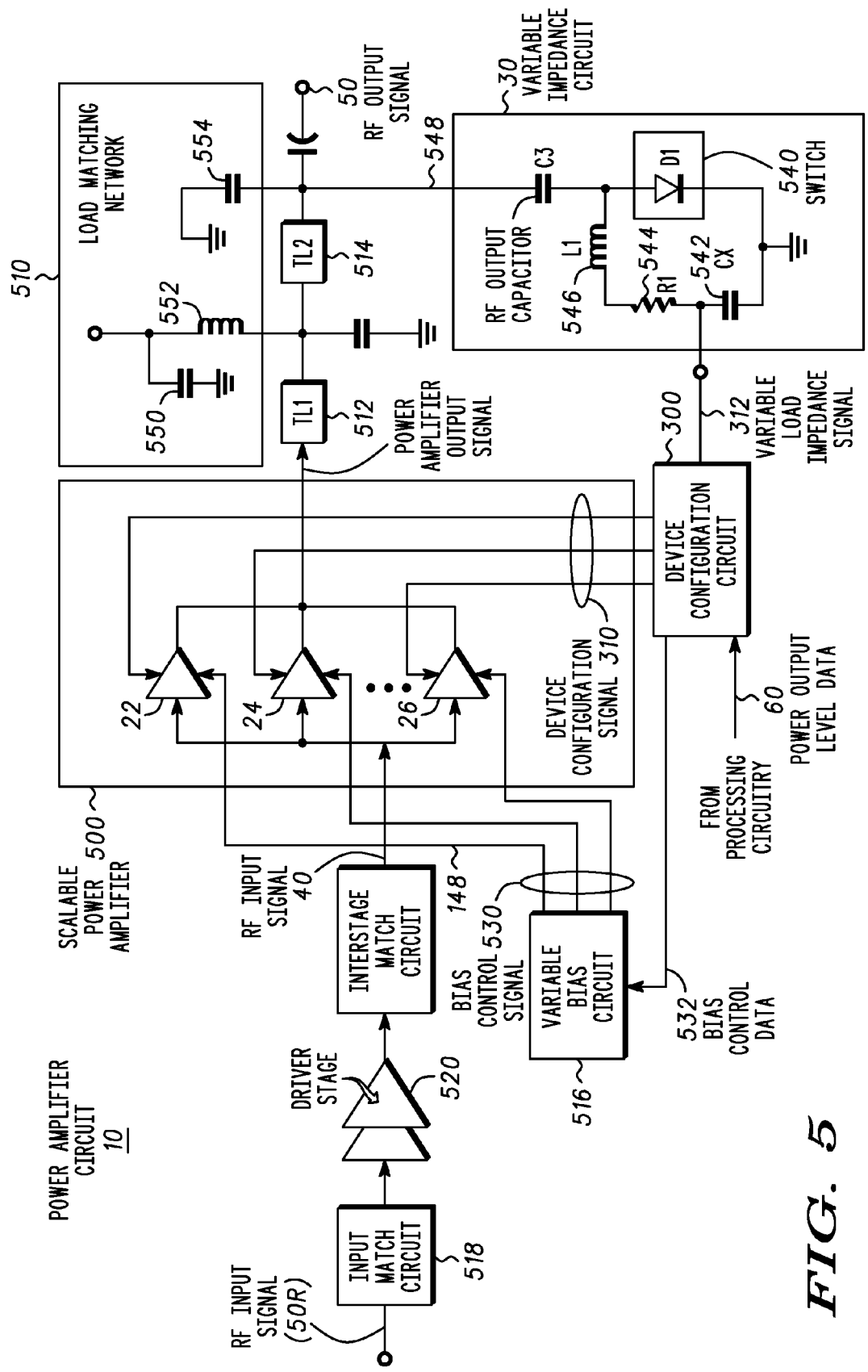
FIG. 5 is a block diagram of an exemplary power amplification circuit and variable impedance circuit according to one embodiment of the invention.

FIG. 5 illustrates another embodiment of the power amplification circuit 10 further including the variable impedance circuit 30, a load matching network 510, a first transmission line 512, a second transmission line 514, a variable bias circuit 516, an input match circuit 518, a driver stage 520, and an interstage match circuit 522. The variable bias circuit 516 produces a bias control signal 530 in response to receiving bias control data 532 to control the bias of each selectively activated amplifier elements 22, 24, and 26. For example the bias control data 532 may indicate to the variable bias circuit 516 the bias level of each selectively activated amplifier elements 22, 24, 26. The bias control signal 530 may provide different levels of bias to each selectively activated amplifier element 22, 24, 26 based on the desired power output level for the RF output signal 50 in order to increase the efficiency of the scalable power amplifier 20.

Variable impedance circuit 30 includes a switch 540, including a pin diode, a ground capacitor 542, a resistor 544, an inductor 546, and an RF output capacitor 548. Device configuration circuit 300 produces the variable load impedance signal 312 in order to control the variable impedance of the variable impedance circuit 30. For example, if the variable load impedance signal 312 provides a voltage level high enough to cause the switch 540(?), such as the pin diode, to become forward biased, then the diode grounds the RF output capacitor 548. In contrast, if the variable load impedance signal 312 is at a sufficiently low voltage to cause the pin diode in switch 540 to turn off, then the RF output capacitor 548 will load the RF output signal 50. Load matching network 510 includes a first capacitor 550, an inductor 552, and a second capacitor 554. The load matching network 510 provides a fixed load to the output of the scalable power amplifier 20 via transmission lines 512, 514.

Figure 6:
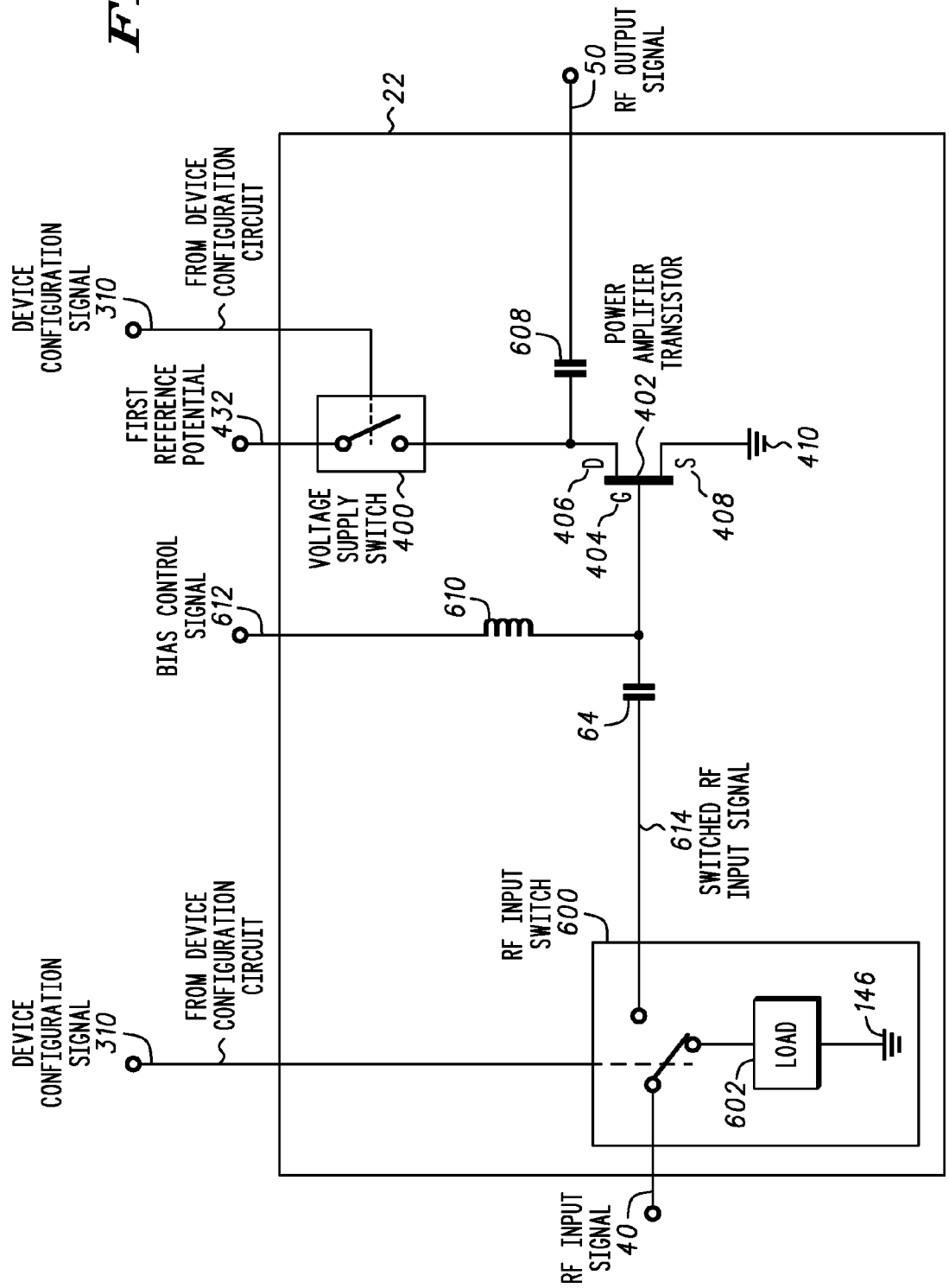
FIG. 6 is a schematic of an exemplary amplifier and voltage supply switch according to one embodiment of the invention.

FIG. 6 is a schematic diagram of one of the selectively activated amplifier element 22, 24, 26 including the power amplifier transistor 402, an RF input switch 600, a load 602, an input capacitor 604, an output capacitor 608, and a bias inductor 610. Each of the selectively activated amplifier elements 22, 24, 26 is coupled to a first reference potential 432, such as a supply voltage, via a voltage supply switch 400. Each voltage supply switch 400 receives a corresponding device configuration signal 310 for each selectively activated amplifier element 22, 24, 26. In response to receiving the device configuration signal 310 associated with the first power output level, the voltage supply switch 400 couples the first reference potential 432 to each selectively activated amplifier element 22, 24, 26. Similarly, in response to receiving a device configuration signal 310 associated with the second power output level, the voltage supply switch 400 reduces power from the first reference potential 432 to each selectively activated amplifier element 22, 24, 26.

According to one embodiment, the device configuration circuit 300 produces a bias control signal 612 to control the bias of power amplifier transistor 402. The bias control signal is coupled to the gate 404 via the first reactive element 610, such as an inductor, to control the bias of the power amplifier transistor 402. According to one embodiment the bias of power amplifier transistor 402 is dynamically controlled in response to receiving the bias control signal 612.

RF input switch 600 receives the RF input signal 40 and produces a switched RF input signal 614. The gate 404 of power amplifier transistor 402 receives the switched RF input signal 614. The RF input switch 600 receives a corresponding device configuration signal 310 to switch the RF input switch 600 on or off. Although the device configuration signal 310 is shown controlling both the voltage supply switch 400 and the RF input switch 600, the device configuration signal 310 may control other devices such as the bias.

The device configuration circuit 300 provides the device configuration signal 310 to the RF input switch 600 to coupled the RF input signal 40 to the gate 404 of power amplifier transistor 402 in response to receiving power output level data 60 associated with the first power output level, such as a high output power level. Similarly, the device configuration circuit 300 provides the device configuration signal 310 to the RF input switch 600 to reduce an amplitude associated with the RF input signal 40 to the gate 404 of power amplifier transistor 402 to operate in the second power output level in response to receiving the power output level data 60 associated with the second power output level, such as a low output power level. For example, RF input switch 600 may operate to completely remove RF input signal 40 from the gate 404 of power amplifier transistor 402. Alternatively RF input switch 600 may reduce in a continuous or discrete manner the signal or an amplitude associated with the RF input signal 40 to the gate 404. According to another embodiment RF input switch 600 couples the RF input signal 40 to produce the switched RF input signal 614 in for example a continuous manner, or a discreet manner. RF input switch 600 may include a transistor, or any other suitable device for switching the RF input signal 40 to the gate 404 of power amplifier transistor 402.

Figure 7:
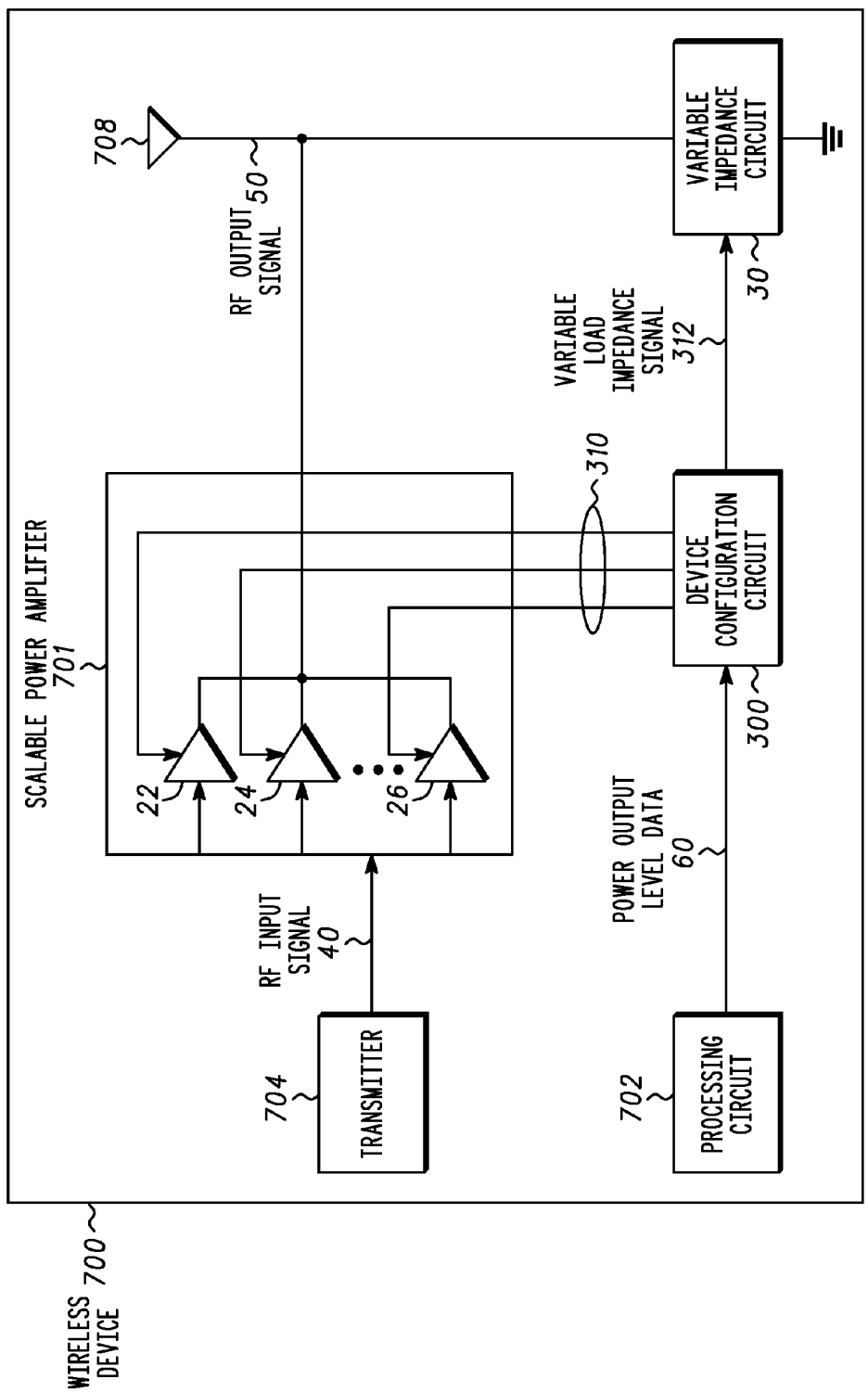
FIG. 7 is a block diagram of a wireless device according to one embodiment of the invention.

FIG. 7 is a block diagram of a wireless device 700 including the scalable power amplifier 20, the variable impedance circuit 30, the device configuration circuit 300, a processing circuit 702, a transmitter 704, and antenna 708. The transmitter 704 provides the RF input signal 40 to the scalable power amplifier 20. The processing circuit 702 provides the power output level data 60 to the device configuration circuit 300.

FIG. 8 is a schematic diagram of scalable power amplifier 20 including a first drain 802, a second drain 804, a third drain 806, a fourth drain 808, a gate 810, a source 812, a first switch transistor 814, a second switch transistor 816, a third switch transistor 818, a fourth switch transistor 820, a first output capacitor 822, a second output capacitor 824, a third output capacitor 826, and a fourth output capacitor 828. Although the scalable power amplifier 20 is shown as a FET transistor having four drains, any number of suitable drain elements may be used. Additionally, any suitable device such as a bipolar transistor may be used. The device configuration circuit 300 provides a first device configuration signal 822, a second device configuration signal 824, a third device configuration signal 826, and a fourth device configuration signal 828 to selectively activate the respective drain elements. Accordingly, the device configuration circuit 300 may configure the scalable power amplifier 20 for any number of different operating ranges in order to achieve a high operating efficiency and a corresponding low power consumption.

Among other advantages, each amplifier element may be selectively activated and the load impedance at the output varied in a coordinated manner to provide the required RF output signal power level in a more optimal manner. The power amplifier circuit operates at a high level of efficiency through out a range of RF output signal power levels. Since the power amplifier circuit operates at a high level of efficiency, power consumption of the power amplification circuit is minimized.

Further, the adaptability of the scalable power amplifier may be used to more readily fulfill a multi-mode role while continuing to maintain more optimal levels of performance as well as accommodate conflicting design requirements, such as operating in a more linear mode of operation or in a more saturated mode of operation. The scalable power amplifier may therefore be dynamically configured to operate with different types of modulation, such as linear or nonlinear modulation, at any desired power level, to achieve a higher efficiency level, resulting in reduced power consumption.

It will be understood that the implementation of other variations and modifications of the invention and its various aspects will be apparent to those with the ordinary skill in the art, and that the invention is not limited by this specific embodiment as described. For example, the scalable power amplifier 20 may include three, four, or more selectively activated amplifier elements. Accordingly, the device configuration circuit 300 may configure each of the selectively activated amplifier elements to achieve a higher operating efficiency. It is therefore contemplated to cover by the present invention any and all modifications, variations or equivalents that fall within the spirit and scope of the basic underlying principles disclosed and claimed herein.

What is claimed is:

1. A power amplifier circuit comprising:
   a scalable power amplifier including an output, and a plurality of activated amplifier elements each operative to produce an RF output signal at the output, and operative to dynamically vary a power output level of the RF output signal in response to power output level data;
   a variable impedance circuit coupled to the output of the scalable power amplifier, and operatively responsive to the power output level data to vary an impedance of the variable impedance circuit to dynamically load the output of the scalable power amplifier; and
   wherein the scalable power amplifier further includes an amplifier configuration circuit operatively responsive to the power output level data to selectively activate the selectively activated amplifier elements by at least reducing power to at least one of the selectively activated amplifier elements and wherein the variable impedance circuit further includes an impedance configuration circuit operatively responsive to the power output level data to dynamically vary the impedance of the variable impedance circuit.

2. The power amplifier circuit of claim 1 wherein the amplifier configuration circuit provides a bias control signal to the scalable power amplifier to control a bias of the scalable power amplifier in response to the power output level data.

3. The power amplifier circuit of claim 1 wherein the amplifier configuration circuit is operatively coupled to at least one of the amplifier elements to dynamically vary a bias level and a power output level of at least one of the amplifier elements in response to the power output level data.

4. The power amplifier circuit of claim 1 wherein the variable impedance circuit includes at least one of resistive and reactive elements coupled via a switch to the output of the scalable power amplifier, and wherein the impedance configuration circuit activates the switch to vary the impedance of the variable impedance circuit and to dynamically load the output of the scalable power amplifier in response to the power output level data.

5. A power amplifier circuit operative to receive an RF input signal and to produce an RF output signal comprising:
   a device configuration circuit operatively responsive to power output level data to provide a device configuration signal and a variable load impedance signal;
   a scalable power amplifier including an output, and a plurality of selectively activated amplifier elements, each operative to receive the RF input signal, and each operative to produce the RF output signal at the output wherein at least one of the selectively activate amplifier elements is operatively responsive to the corresponding device configuration signal to operate in at least one of the first power output level and the second power output level, to vary a power output level of the scalable power amplifier;
   a variable impedance circuit also coupled to the output of the scalable power amplifier and operatively responsive to the variable load impedance signal received from the device configuration circuit to provide a first impedance load at the output of the scalable power amplifier corresponding to the first power output level, and a second impedance load at the output of the scalable power amplifier corresponding to the second power output level; and wherein each of the at least one of the plurality of selectively activated amplifier elements is operatively coupled to a first reference potential via a corresponding voltage supply switch wherein:

the corresponding voltage supply switch couples the first reference potential to the corresponding amplifier in response to a device configuration signal associated with the first power output level, and the corresponding voltage supply switch reduces the first reference potential to the corresponding amplifier in response to a device configuration signal associated with the second power output level.

6. The power amplifier circuit of claim 5 wherein the device configuration circuit produces a bias control signal, wherein each of the selectively activated amplifier elements includes an FET transistor having a gate operative to receive the RF input signal and the bias control signal via a reactive element, a drain operatively coupled to the output and to the corresponding voltage supply switch to receive the first reference potential in response to the device configuration signal, and a source operatively coupled to a second reference potential.

7. The power amplifier circuit of claim 5 wherein the at least one of the plurality of selectively activated amplifier elements that operates in the second power output level does not substantially receive the first reference potential.

8. The power amplifier circuit of claim 6, wherein each voltage supply switch includes at least one of an FET transistor including a gate operative to receive the device configuration signal, a drain operative to receive the first reference potential a source operatively coupled to the drain of the corresponding parallel coupled amplifier, and a bipolar transistor including a base operative to receive the device configuration signal, a collector operative to receive the first reference potential, and an emitter operatively coupled to the drain of the corresponding parallel coupled amplifier.

9. The power amplifier circuit of claim 5, wherein the at lease one of the plurality of selectively activated amplifier elements transitions between the first power output level and the second power output level in at least one of a continuous manner and a discrete manner.

10. A power amplifier circuit operative to receive RF input signal and to produce an RF output signal comprising:

a device configuration circuit operatively responsive to power output level data to provide a device configuration signal and a variable load impedance signal associated with a first and second power output level;

a scalable power amplifier having an output, and a plurality of selectively activated amplifier elements, each operative to receive the RF input signal via a corresponding RF input switch, and each selectively activated amplifier element is operative to produce the RF output signal at the output of the scalable power amplifier, wherein at least one of the plurality of selectively activated amplifier elements is operatively responsive to the device configuration signal associated with the first power output level to receive the RF input signal from the corresponding RF input switch, wherein at least one of the plurality of selectively activated amplifier elements is operatively responsive to the device configuration signal associated with the second power output level to receive the RF input signal having a reduced amplitude from the corresponding RF input switch;

a variable impedance circuit coupled to the output of the scalable power aplifier and operatively responsive to the variable load impedance signal to provide a first impedance load at the output of the scalable power amplifier associated with the first power output level, and a second impedance load at the output of the scalable power amplifier associated with the second power output level; and a variable bias circuit operatively coupled to the device configuration circuit to receive bias control data and to responsively produce a bias control signal in response to bias control data to control a bias of at least one of the selectively activated amplifier elements.

11. The power amplifier circuit of claim 10, wherein each RF input switch switches the received RF input signal to the selectively activated amplifier element in at least one of a continuous manner and a discrete manner.

12. A wireless device comprising:

a processing circuit operative to produce power output level data;

a scalable power amplifier including an output, and a plurality of selectively activated amplifier elements each operative to produce an RF output signal at the output, and operative to dynamically vary a power output level in response to the power output level data;

a variable impedance circuit coupled to the output of the scalable power amplifier, and operatively responsive to the power output level data to vary an impedance of the variable impedance circuit to dynamically load the output of the scalable power amplifier;

an antenna operatively coupled to the output of the scalable power amplifier and operative to transmit the RF output signal; and wherein the scalable power amplifier further includes an amplifier configuration circuit operatively responsive to the power output level data to selectively activate the selectively activated amplifier elements by at least one of reducing power to at least one of the selectively activated amplifier elements and controlling a bias of at least one of the selectively activated amplifier elements, and wherein the variable impedance circuit further includes an impedance configuration circuit operatively responsive to the power output level data to dynamically vary the impedance of the variable impedance circuit.

13. The wireless device of claim 12 wherein the device configuration circuit provides a bias control signal to the scalable power amplifier to control a bias of the scalable power amplifier in response to the power output level data.

14. An amplification method comprising:

selectively activating at least one selectively activated amplifier element within a scalable power amplifier including an output to vary a power output level of the scalable power amplifier;

varying an impedance of a variable impedance circuit coupled to the output to dynamically load the scalable power amplifier by varying the impedance of the variable impedance circuit; and wherein the selectively activated amplifier elements are selectively activated by at least one of reducing power to at least one of the selectively activated amplifier elements, increasing power to at least one of the selectively activated amplifier elements and controlling a bias of at least one of the selectively activated amplifier elements.

15. The method of claim 14 including providing a bias control signal to the at least selectively activated amplifier elements to control a bias of the plurality of selectively activated amplifier elements.

16. The method of claim 14 comprising:
receiving an RF input signal by the scalable power amplifier, wherein each of the at least one selectively activated amplifier element receives the RF input signal; and
producing an RF output signal by the at least one selectively activated amplifier element.

17. The method of claim 14 comprising:
providing a first reference potential to the at least one selectively activated amplifier element, to operate in a first power output level in response to a device configuration signal associated with the first power output level; and
reducing a voltage from the first reference potential to the at least one selectively activated amplifier element to operate in a second power output level, in response to a device configuration signal associated with the second power output level.

* * * * *